United States Patent
Torek et al.

(10) Patent No.: US 6,200,909 B1
(45) Date of Patent: Mar. 13, 2001

(54) METHOD FOR SELECTIVE ETCHING OF ANTIREFLECTIVE COATINGS

(75) Inventors: Kevin James Torek; Whonchee Lee; Satish Bedge, all of Boise, ID (US)

(73) Assignee: Micron Technology Inc., Boise, ID (US)

( * ) Notice: Subject to any disclaimer, the term of this patent is extended or adjusted under 35 U.S.C. 154(b) by 0 days.

(21) Appl. No.: 09/495,518

(22) Filed: Feb. 1, 2000

Related U.S. Application Data

(63) Continuation of application No. 09/382,399, filed on Aug. 25, 1999, which is a continuation of application No. 09/042,086, filed on Mar. 13, 1998, now Pat. No. 5,981,401.

(51) Int. Cl.$^7$ .................... H01L 21/302; C09K 13/00; C09K 13/04; C09K 13/08; C09K 13/06
(52) U.S. Cl. .................... 438/745; 438/756; 438/757; 252/79.1; 252/79.2; 252/79.3; 252/79.4
(58) Field of Search .................... 438/745, 756, 438/757; 252/79.4, 79.2, 79.3, 79.1

(56) References Cited

U.S. PATENT DOCUMENTS

| | | |
|---|---|---|
| 3,979,241 | 9/1976 | Maeda et al. .................... 438/637 |
| 4,113,551 | 9/1978 | Bassous et al. .................... 438/753 |
| 4,269,654 | 5/1981 | Deckert et al. .................... 438/756 |
| 5,472,562 | 12/1995 | Ziger .................... 438/703 |
| 5,668,052 | 9/1997 | Matsumoto et al. .................... 438/624 |
| 5,872,055 | * 10/1996 | Jenq et al. .................... 438/636 |
| 5,885,903 | 3/1999 | Torek et al. .................... 438/756 |
| 5,965,465 | 10/1999 | Rath et al. .................... 438/745 |
| 5,981,401 | * 11/1999 | Torek et al. .................... 437/745 |

FOREIGN PATENT DOCUMENTS

| | | | |
|---|---|---|---|
| 19648471A1 | * 10/1997 | (DK) . | |
| 2170649A | * 10/1997 | (DE) . | |
| 0758797 A1 | * 2/1997 | (EP) .................... | H01L/21/311 |
| 0758797A1 | 2/1997 | (EP) .................... | H01L/2/311 |

OTHER PUBLICATIONS

Jenq et al., Manufacture of polysilicon conductive line–avoiding bottle–necking effect on non–flat field oxide edge, Abstract of TW 313701A, Aug. 1997.*

* cited by examiner

Primary Examiner—Benjamin L. Utech
Assistant Examiner—Lynette T. Umez-Eronini
(74) Attorney, Agent, or Firm—Dickstein Shaprio Morin & Oshinsky LLP

(57) ABSTRACT

The present invention relates to the fabrication of integrated circuit devices, and more particularly, to a method of etching inorganic antireflective layers without etching excessive amounts of an underlying oxide.

43 Claims, 2 Drawing Sheets

PRIOR ART

PRIOR ART

METHOD FOR SELECTIVE ETCHING OF ANTIREFLECTIVE COATINGS

This application is a continuation of application, Ser. No. 09/382,399 filed Aug. 25, 1999, the entirety of which is incorporated herein by reference which is a continuation of application Ser. No. 09/042,086 filed Mar. 13, 1998 and now U.S. Pat. No. 5,981,401.

FIELD OF THE INVENTION

The present invention relates to the fabrication of integrated circuit devices, and more particularly, to a method of etching inorganic antireflective coatings (also referred to as Dielectric Antireflective Coatings or DARCs) without etching excessive amounts of the underlying oxide layer.

BACKGROUND OF THE INVENTION

Inorganic antireflective coatings are used to counteract the overexposure which can occur with structures that reflect exposure light. To illustrate, referring to FIG. 1, there is shown a partially completed integrated circuit. Field oxide regions 11 have been formed in and on a semiconductor substrate 10. Polysilicon or polycide gate electrodes 14 have been formed. A dielectric layer 16 covers the gate electrodes. An oxide layer 20, typically borophosphosilicate glass (BPSG), is grown over the dielectric layer 16. A layer of photoresist is coated over the oxide layer 20 and patterned to form a mask. Because of the reflective surface of the oxide layer 20 and the intensity of the deep ultraviolet light 22 used, the light rays 22 are reflected onto the photoresist layer (PR) causing overexposure. The resulting photoresist mask has a notch in it. Therefore, when subsequent layers are patterned according to the photoresist mask and etched, a notch 24 will result, as shown in top view in FIG. 2.

In order to counteract this problem, an antireflective coating (DARC) 24 is commonly used, as shown in FIG. 3. The DARC 24 is generally composed mostly of Si, with the next most abundant element being O, and the balance N. Once exposure is complete, the DARC is removed using wet etching.

Wet etching solutions significantly, and sometimes even preferentially, attack silicon oxides such as BPSG. Accordingly, when performing wet etches, excessive amounts of the underlying oxide layer 20 may be removed, especially when using BPSG. When this occurs, as illustrated in FIG. 4, an overhang of the DARC 24 is produced. This overhang can interfere or react with subsequent depositions, for example, when layers are deposited into a cavity over which the DARC 24 extends.

Prior art etching techniques refer to the use of particular solvents for etching in certain circumstances. Wei et al., U.S. Pat. No. 5,449,639, refers to a method of metal etching using a solution of hydrogen peroxide, ammonia, and water. Izumi et al., U.S. Pat. No. 5,022,961, refers to etching thermal oxide films of silicon with hydrofluoric acid (HF) or other halide-containing species in combination with alcohol. Maeda et al., U.S. Pat. No. 4,746,397 describes etching $SiO_2$ films with the use of a flourine-containing species and an alcohol, ketone or carboxylic acid.

What are still needed, however, are methods designed for the selective etching of DARCs while preventing or minimizing the etching of the adjacent oxide.

SUMMARY OF THE INVENTION

By "selectively" etching the DARC it is meant that the etch is preferential to the DARC relative to the adjacent oxide and that the DARC is etched at a rate greater than the oxide. The present invention provides a method for selectively etching antireflective coatings such as DARC.

According to one aspect of the present invention, DARC is selectively etched using a flourine-containing, ionizable compound in solution with an acid or a base. In a preferred embodiment, the etchant is composed of about 35–40 wt. % $NH_4F$ and about 0.9–5.0 wt. % $H_3PO_4$ in an aqueous solution.

According to another aspect of the present invention, oxidizing agents are added to etchants to produce DARC/BPSG etch rates >1. A preferred embodiment of this method includes adding about one part of hydrogen peroxide ($H_2O_2$), and between 30 and 300 parts of an etchant comprised of about 39.2–39.9 wt. % ammonium fluoride, and about 0.9 wt. % phosphoric acid in an aqueous solution. Another preferred embodiment of this method uses an etchant comprised of about 1 part TMAH (25 wt. % tetramethyl ammonium hydroxide and 75 wt. % aqueous solution, preferably water) and between about 6 and 7 parts of aqueous solution, preferably water.

According to yet another aspect of the present invention, the pH level of an etchant is raised to between 11 and 14.

These and other objects, features and advantages of the invention will become apparent from the following detailed description of preferred embodiments of the present invention.

DETAILED DESCRIPTION OF PREFERRED EMBODIMENTS

The present invention relates generally to the etching of DARC preferentially to surrounding oxide layers and structures. Accordingly, the present invention is broadly applicable to all fields where it is desirable to remove DARC and preserve oxide.

In addition, the present invention involves wet etching. Wet etching involves the application, either by spray or immersion, of a chemical etchant in liquid form on the surface which is to be etched. The etchant is then left in contact with the surface for a desired period of time based upon the strength of the etchant and the depth of the etch desired. Once the desired period of time has elapsed, the chemical etchant is then removed, typically by rinsing the etched surface with deionized water.

The term "etchant" refers to chemicals used to dissolve layers of targeted material. The term "substrate" refers to the lowest layer of semiconductor material in a semiconductor wafer. The term "semiconductor device structures" refers to all structures fabricated on the substrate to include all gates, diodes, junctions, resistors, capacitors, insulators, and contacts.

Figure 1:
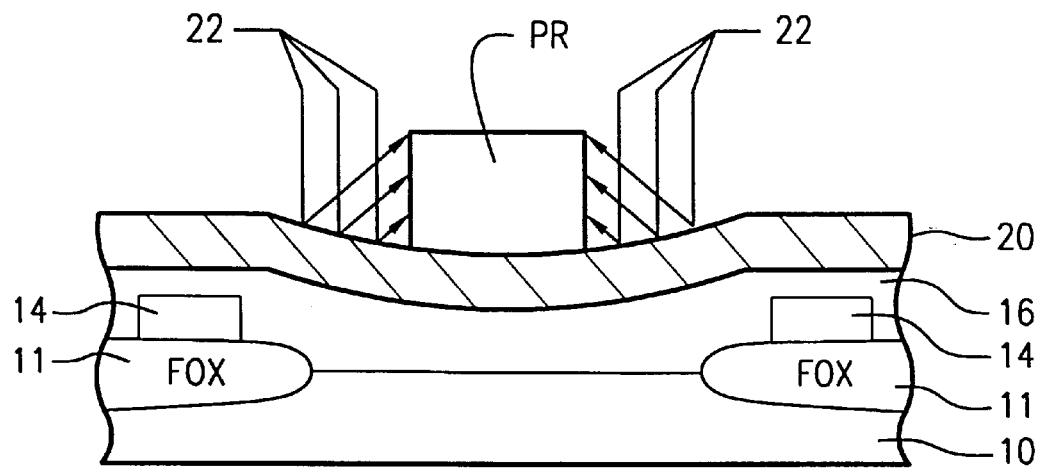
FIG. 1 is a cross-sectional view of a partially completed integrated circuit undergoing exposure.
Figure 2:
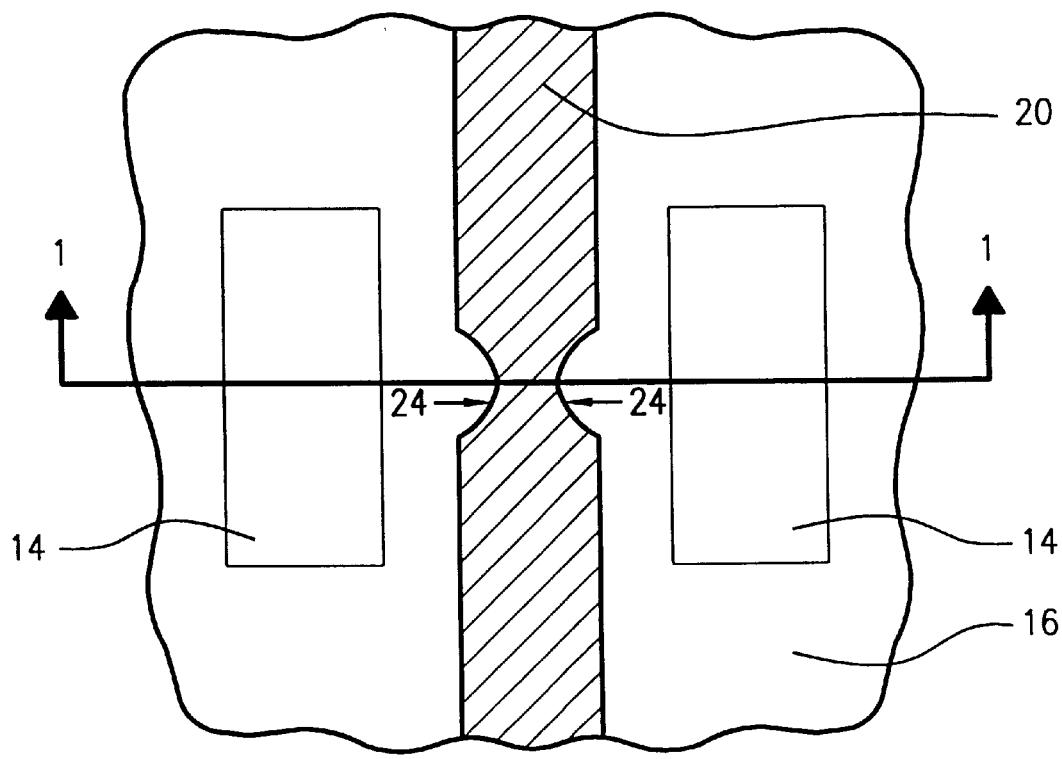
FIG. 2 is an overhead view of the FIG. 1 structure illustrating the notching problem.
Figure 3:
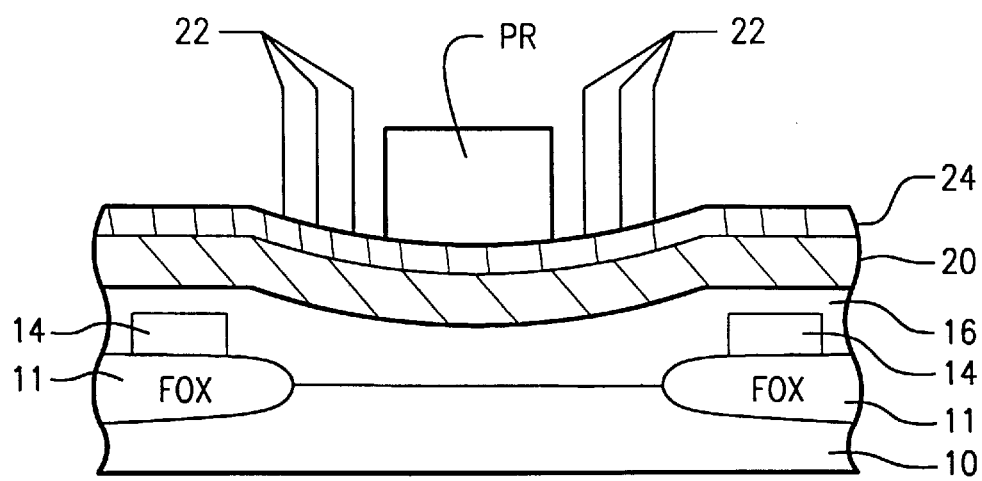
FIG. 3 is a cross-sectional view of a partially completed integrated circuit undergoing exposure in which a DARC layer has been applied to protect the photoresist PR.

The first preferred embodiment of the present invention will be described with reference to FIG. 3. In this figure, there is shown a portion of a partially completed integrated circuit consisting of a substrate 10, preferably composed of monocrystalline silicon. Field oxide regions 11 and semiconductor device structures such as polysilicon or polycide gate electrodes 14 are formed in and on the substrate 10. A thick insulating dielectric layer 16 is deposited over the semiconductor device structures. An oxide layer 20 is then grown over the dielectric layer 16. According to the preferred embodiment, the oxide layer is composed of borophosphosilicate glass (BPSG); however other oxides such as phosphosilicate glass (PSG), silicon dioxide, or the like can also be used. Next, a DARC layer 24 is deposited over the oxide layer 20, typically by Chemical Vapor Deposition (CVD).

The DARC layer 24 is generally composed mostly of Si, then the next most abundant element is O, the balance is N. Such antireflective coatings or DARCs produced from Si/N/O are termed inorganic antireflective coatings and are designed to absorb deep ultraviolet light. Example compositions of DARCs are as follows:

DARC 320: 65%/25%/10% for Si/O/N atomic concentrations.

I-line DARC: 54%/36%/10% for Si/O/N atomic concentrations.

High K DARC: >65% Si, Balance =O, N atomic concentrations, for example, 70%/20%/10% for Si/O/N atomic concentrations.

Once the DARC 24 is applied, a layer of photoresist PR is coated over the substrate and patterned to provide a photoresist mask. The DARC 24 prevents the overexposure of the photoresist PR and also prevents the pitting of the oxide layer 20 during photoresist stripping. Once exposure is complete, it is often desirable to remove the DARC 24. A wet etch is used for DARC removal.

Figure 4:
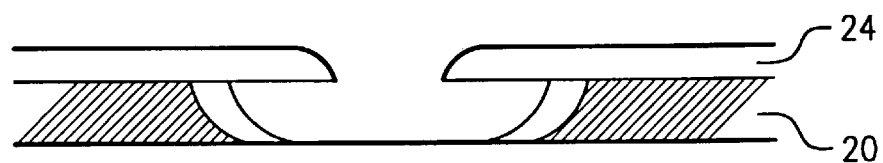
FIG. 4 is a cross-sectional view illustrating the problem of undercutting a DARC layer.

As discussed above, during the wet etch, it is preferred that the etching solution have a high selectivity for the DARC as opposed to the oxide layer 20 so as not to cause undercutting of the DARC 24. An undercutting of the DARC 24 can be seen in FIG. 4. According to one aspect of the present invention, DARC is selectively etched using a flourine-containing, ionizable compound in an aqueous solution. According to a preferred embodiment, the etchant is comprised of 10–40 wt. % of a fluorinated compound in an aqueous solution. According to a second preferred embodiment, the etchant is composed of about 35–40 wt. % $NH_4F$ and about 0.9–5.0 wt. % $H_3PO_4$ in an aqueous solution.

By applying these fluorine and ammonium fluoride mixtures, DARC/BPSG etch rates >1 are achieved and the DARC 24 is etched while the BPSG layer is preserved.

According to a second aspect of the present invention, DARC/BPSG etch rates >1 can additionally be achieved by adding oxidizing agents to known etchants. Known etchants may include but are not limited to compounds containing HCl, $HNO_3$, HF, or $H_2SO_4$. Preferred oxidizing agents include but are not limited to $O_3$ and $H_2O_2$. A preferred embodiment of this method includes adding about one part by weight of hydrogen peroxide ($H_2O_2$), and between 30 and 300 parts by weight of an etchant comprised of about 39.2–39.9 wt. % ammonium fluoride, and about 0.9 wt. % phosphoric acid in an aqueous solution.

A further preferred embodiment of this method includes adding one part by weight of hydrogen peroxide ($H_2O_2$) to between 30 and 300 parts by weight of an etchant composed of 39.2–39.9 wt. % ammonium fluoride, 0.9 wt. % phosphoric acid, and 59.2–59.9 wt. % water.

A further preferred embodiment of this method uses an etchant comprised of about 1 part TMAH (25 wt. % tetramethyl ammonium hydroxide and 75 wt. % aqueous solution, preferably water) and between about 6 and 7 parts of aqueous solution, preferably water.

This solution etches 217–537 angstroms of High K DARC and only 2–3 angstroms of BPSG, in 5 minutes.

According to the present invention, by the addition of an oxidizing agent to the original etchant, high K DARC etch rates of 43–100 Angstroms/minute are achieved. Measuring the relative etch rates of the oxider-enhanced etchant and the original etchant for etching I-line DARC compared to BPSG, the original etchant produces an etch ratio or selectivity of approximately 1. Thus, the original etchant etches both DARC and BPSG at approximately the same rate. The oxider-enhanced etchant, according to the present invention, produces etch ratios or selectivities >2. Thus, the oxidizer-enhanced etchant etches I-line DARC at more than twice the rate it etches BPSG.

According to another aspect of the present invention, DARC/BPSG etch rates >1 can additionally be achieved by increasing the pH levels of etchants so that the pH is greater than 11 and is preferably between 11 and 14. pH levels are manipulated in the present invention by varying the strength of the bases which are used to prepare the etchants. A preferred embodiment of this method comprises an aqueous solution containing $NH_4OH$.

Temperature is not a critical variable in mixing or using any of the above embodiments. A temperature range of 19.5–23.5 degrees Celsius is typical for most applications.

The above descriptions and drawings are only illustrative of preferred embodiments which achieve the objects, features and advantages of the present invention, and it is not intended that the present invention be limited thereto. Any modification of the present invention which comes within the spirit and scope of the following claims is considered part of the present invention.

What is claimed as new and desired to be protected by Letters Patent of the United States is:

1. A method of etching an inorganic antireflective coating in contact with an oxide, said method comprising:

applying an etchant to said inorganic antireflective coating, said etchant being characterized in that it etches said inorganic antireflective coating at a rate greater than said oxide;

wherein said etchant comprises an oxidizing agent and TMAH tetramethyl ammonium hydroxide).

2. A method of etching as set forth in claim 1, wherein said etchant comprises about 1 part TMAH (25 wt. % tetramethyl ammonium hydroxide and 75 wt. % aqueous solution) and between about 6 and 7 parts of aqueous solution.

3. A method of forming a semiconductor device, comprising:

forming an inorganic antireflective layer over an oxide layer;

etching a portion of said inorganic antireflective layer and an underlying portion of said oxide layer, wherein said oxide layer is etched in such amounts so that no portion of said inorganic antireflective layer overhangs said oxide layer; wherein said etchant comprises TMAH (tetramethylammonium hydroxide).

4. The method of claim 3, wherein said etchant comprises a fluorine-containing compound in an aqueous solution.

5. The method of claim 3, wherein said etchant comprises about 10–40 wt. % of a fluorine-containing compound in an aqueous solution.

6. The method of claim 3, wherein said etchant comprises about 35–40 wt. % $NH_4F$ and about 0.9–5.0 wt. % $H_3PO_4$ in an aqueous solution.

7. The method of claim 3, wherein said etchant further comprises an oxidizing agent.

8. The method of claim 7, wherein said oxidizing agent is selected from the group consisting of $O_3$ and $H_2O_2$.

9. The method of claim 7, wherein said etchant comprises about one part by weight hydrogen peroxide ($H_2O_2$), and between 30 and 300 parts by weight of a mixture of about 39.2–39.9 wt. % ammonium fluoride, and about 0.9 wt. % phosphoric acid in an aqueous solution.

10. The method of claim 7, wherein said etchant comprises TMAH (tetramethyl ammonium hydroxide).

11. The method of claim 10, wherein said etchant comprises about 1 part TMAH (25 wt. % tetramethyl ammonium hydroxide and 75 wt. % aqueous solution) and between about 6 and 7 parts of aqueous solution.

12. The method of claim 3, wherein said etchant has a pH greater than 11.

13. The method of claim 12, wherein said etchant has a pH less than 14.

14. The method of claim 13, wherein said etchant comprises $NH_4OH$.

15. A method of fabricating an integrated circuit, said method comprising:

providing an insulating layer over semiconductor device structures on a semiconductor substrate;

providing an oxide layer over said insulating layer;

providing an antireflective layer over said oxide layer;

providing a layer of photoresist over said antireflective layer;

patterning said photoresist layer; and etching a portion of said antireflective layer and an underlying portion of said oxide layer, wherein said oxide layer is etched in such amounts so that no portion of said antireflective layer overhangs said oxide layer; wherein said etchant comprises TMAH (tetramethylammonium hydroxide).

16. The method of claim 15, wherein said etchant comprises a fluorine-containing compound.

17. The method of claim 16, wherein said etchant comprises about 10–40 wt. % of a fluorine-containing compound in an aqueous solution.

18. The method of claim 17, wherein said etchant comprises about 35–40 wt. % $NH_4F$ and about 0.9–5.0 wt. % $H_3PO_4$ in an aqueous solution.

19. The method of claim 18, wherein said oxide layer is selected from the group consisting of borophosphosilic glass (BPSG), phosphosilicate glass (PSG), and silicon dioxide.

20. The method of claim 15, wherein said etchant comprises an oxidizing agent.

21. The method of claim 20, wherein said oxidizing agent is selected from the group consisting of $O_3$ and $H_2O_2$.

22. The method of claim 21, wherein said etchant comprises about one part by weight of hydrogen peroxide ($H_2O_2$), and between 30 and 300 parts by weight of a mixture about 39.2–39.9 wt. % ammonium fluoride, and about 0.9 wt. % phosphoric acid in an aqueous solution.

23. The method of claim 22, wherein said oxide layer is selected from the group consisting of borophosphosilic glass (BPSG), phosphosilicate glass (PSG), and silicon dioxide.

24. The method of claim 21, wherein said etchant comprises about 1 part TMAH (25 wt. % tetramethyl ammonium hydroxide and 75 wt. % aqueous solution) and between about 6 and 7 parts of aqueous solution.

25. The method of claim 24, wherein said oxide layer is selected from the group consisting of borophosphosilic glass (BPSG), phosphosilicate glass (PSG), and silicon dioxide.

26. The method of claim 15, wherein said etchant has a pH greater than 11.

27. The method of claim 26, wherein said etchant has a pH less than 14.

28. The method of claim 27, wherein said etchant comprises $NH_4OH$.

29. A method of fabricating an integrated circuit, said method comprising:

providing an insulating layer over semiconductor device structures on a semiconductor substrate;

providing an oxide layer over said insulating layer;

providing an antireflective layer over said oxide layer;

providing a layer of photoresist over said antireflective layer;

patterning said photoresist layer;

applying an etchant to said antireflective layer wherein said antireflective layer is etched at a rate exceeding the rate of said oxide layer; wherein said etchant comprises TMAH (tetramethylammonium hydroxide).

30. A method of fabricating an integrated circuit as set forth in claim 29 wherein said etchant comprises a fluorine-containing compound.

31. A method of fabricating an integrated circuit as set forth in claim 30 wherein said etchant comprises about 10–40 wt. % of a fluorine-containing compound in an aqueous solution.

32. A method of fabricating an integrated circuit as set forth in claim 31 wherein said etchant comprises about 35–40 wt. % $NH_4F$ and about 0.9–5.0 wt. % $H_3PO_4$ in an aqueous solution.

33. A method of fabricating an integrated circuit as set forth in claim 32 wherein said oxide layer is selected from the group consisting of borophosphosilic glass (BPSG), phosphosilicate glass (PSG), and silicon dioxide.

34. A method of fabricating an integrated circuit as set forth in claim 29 wherein said etchant comprises an oxidizing agent.

35. A method of fabricating an integrated circuit as set forth in claim 34 wherein said oxidizing agent is selected from the group consisting of $O_3$ and $H_2O_2$.

36. A method of fabricating an integrated circuit as set forth in claim 35 wherein said etchant comprises about one part by weight of hydrogen peroxide ($H_2O_2$), and between 30 and 300 parts by weight of a mixture about 39.2–39.9 wt. % ammonium fluoride, and about 0.9 wt. % phosphoric acid in an aqueous solution.

37. A method of fabricating an integrated circuit as set forth in claim 36 wherein said oxide layer is selected from the group consisting of borophosphosilic glass (BPSG), phosphosilicate glass (PSG), and silicon dioxide.

38. A method of fabricating an integrated circuit as set forth in claim 35 wherein said etchant comprises about 1 part TMAH (25 wt. % tetramethyl ammonium hydroxide and 75 wt. % aqueous solution) and between about 6 and 7 parts of aqueous solution.

39. A method of fabricating an integrated circuit as set forth in claim 38 wherein said oxide layer is selected from the group consisting of borophosphosilic glass (BPSG), phosphosilicate glass (PSG), and silicon dioxide.

40. A method of fabricating an integrated circuit as set forth in claim 39 wherein said etchant has a pH greater than 11.

41. A method of fabricating an integrated circuit as set forth in claim 40 wherein said etchant has a pH less than 14.

42. A method of fabricating an integrated circuit as set forth in claim 41 wherein said etchant comprises $NH_4OH$.

43. A method of fabricating an integrated circuit as set forth in claim 42 wherein said oxide layer is selected from the group consisting of borophosphosilic glass (BPSG), phosphosilicate glass (PSG), and silicon dioxide.

* * * * *